United States Patent [19]

Mundt et al.

[11] Patent Number: 5,702,533

[45] Date of Patent: Dec. 30, 1997

[54] PARTICULATE FREE VACUUM COMPATIBLE PINCH SEAL

[75] Inventors: Randall S. Mundt, Pleasanton; Kenneth R. Krieg, Fremont, both of Calif.

[73] Assignee: Lam Research Corporation, Fremont, Calif.

[21] Appl. No.: 672,317

[22] Filed: Jun. 28, 1996

[51] Int. Cl.[6] ................................. C23C 16/00
[52] U.S. Cl. ............... 118/733; 118/729; 414/935; 49/31; 49/475.1; 49/478.1; 204/298.23
[58] Field of Search ............... 118/733, 729, 118/718, 719; 414/935; 49/31, 69, 475.1, 478.1, 489.1, 498.1, 499.1; 204/298.23, 298.24, 298.25, 298.26, 298.27, 298.28

[56] References Cited

U.S. PATENT DOCUMENTS

| | | | |
|---|---|---|---|
| 4,672,888 | 6/1987 | Crombie et al. | 98/29 |
| 4,833,790 | 5/1989 | Spencer et al. | 33/520 |
| 5,538,610 | 7/1996 | Gesche et al. | 204/298.15 |

FOREIGN PATENT DOCUMENTS 2422807 12/1979 France ................... 49/499.1

Primary Examiner—R. Bruce Breneman
Assistant Examiner—Jeffrie R. Lund
Attorney, Agent, or Firm—Burns, Doane, Swecker & Mathis, L.L.P.

[57] ABSTRACT

A pinch seal in which particle generation by frictional contact is prevented so that the pinch seal can be used in a semiconductor processing apparatus where elimination of particulate contamination is desirable. The pinch seal is particularly adapted for use in connection with a semiconductor wafer transport device, such as a linear transport device. The pinch seal is formed in a barrier provided between a transport device and a semiconductor processing work environment. One or more support members for transporting a wafer extend through the pinch seal. In one embodiment, the pinch seal includes a flexible sealing member with a magnetic strip extending along the length of the flexible sealing member. A mechanism which does not physically contact the flexible sealing member, such as a device generating a magnetic field, is used to selectively open and close the flexible sealing member to prevent contact between the flexible sealing member and the support member passing through the flexible sealing member while retaining the isolating function of the shielding member.

19 Claims, 2 Drawing Sheets

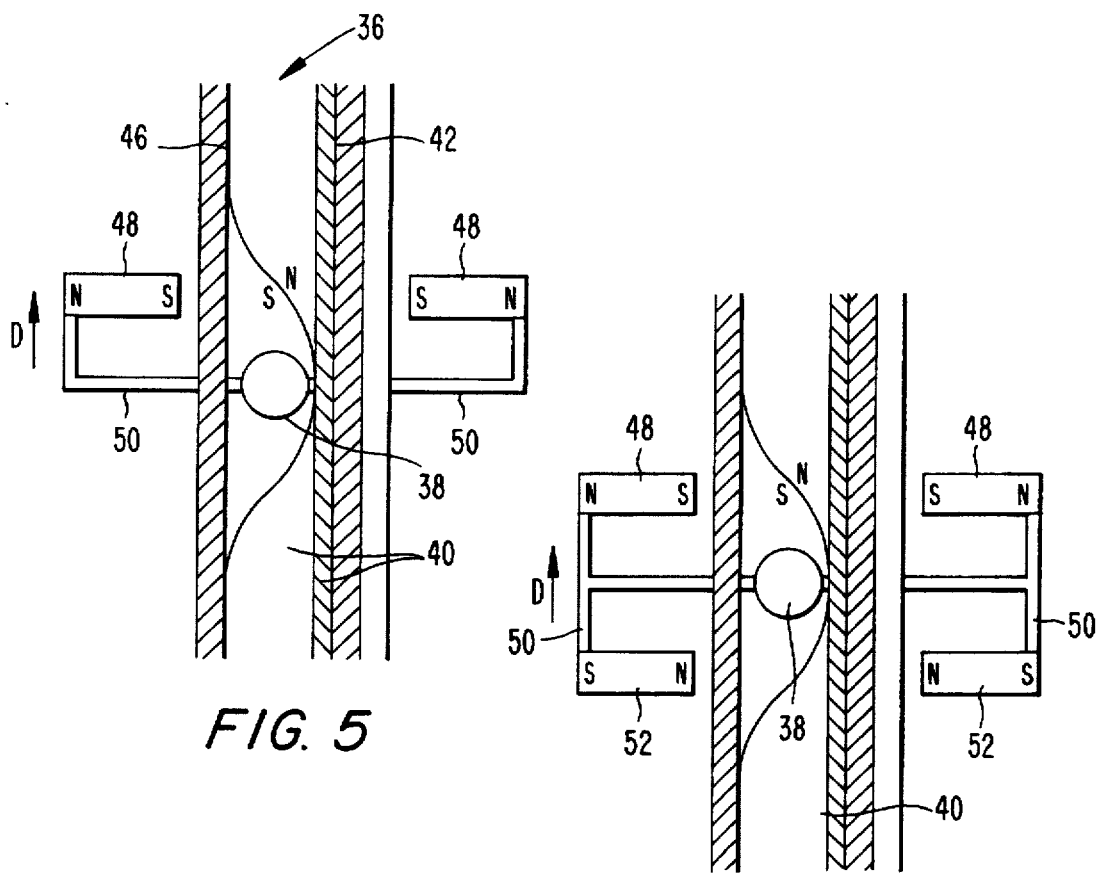
FIG. 5
FIG. 6
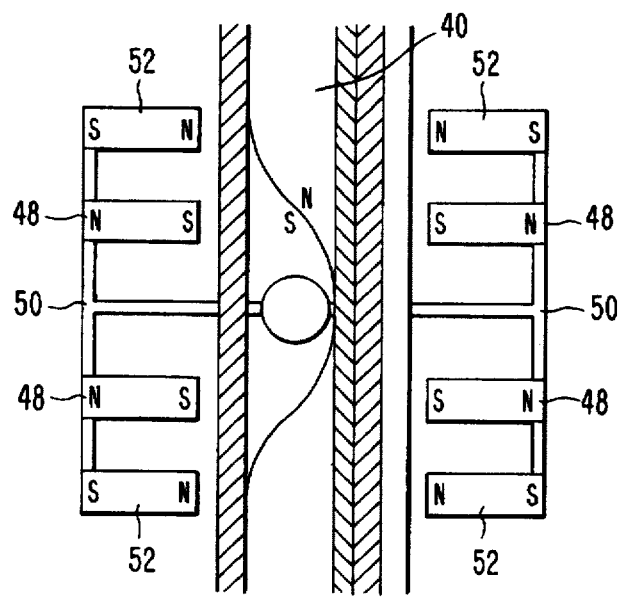
FIG. 7

PARTICULATE FREE VACUUM COMPATIBLE PINCH SEAL

FIELD OF THE INVENTION

The present invention relates to a particulate free vacuum compatible pinch seal, and more particularly, to a linear pinch seal for use in preventing particulate contamination of semiconductor processing equipment.

BACKGROUND OF THE INVENTION

Semiconductor manufacturing processes are extremely sensitive to contamination by particulate matter which enters a semiconductor processing chamber. For example, a single 0.25 micron particle at any step in the process can render an entire integrated circuit inoperable. This sensitivity to particulate contamination, combined with the large number of discrete manufacturing operations require that the producers of semiconductor manufacturing equipment take extreme steps to reduce and control the occurrence of particulate within a semiconductor processing system.

Modern semiconductor manufacturing equipment is highly automated, allowing silicon wafers to be automatically transferred or moved from one portion of the equipment to another, often under vacuum conditions. The mechanisms and equipment used to transfer products in other types of manufacturing operations are usually not suitable for semiconductor manufacturing equipment because of particulate generation.

A common requirement within a semiconductor processing system, such as a plasma etcher, is to linearly move or translate a silicon wafer within the system from one processing chamber to another. Commonly available linear transport mechanisms utilize bearings, guides, stays, gears, wheels, etc. which, due to rubbing or rolling contact between these parts, can produce large numbers of particles. Semiconductor processing equipment often uses rotary arm mechanisms to accomplish the required linear translations because rotary arm mechanisms can be easily adapted to minimize particulate generation.

One reason that rotary mechanisms are commonly used within semiconductor processing systems is that the potential sources of particles can be localized at a seal formed around the rotary shaft. This localization allows the particulate sources to be suitably positioned with respect to the wafer and for the use of shields or barriers designed to prevent the transfer of particles from the particle generating areas to the wafer. The use of distance, traps, and shields has proven effective in the control of particulate generation from rotary seals and joints.

However, there are disadvantages in the use of rotary arm mechanisms to accomplish linear transport functions in semiconductor processing systems. The disadvantages include size, cost, and complexity of the rotary arm mechanisms. These disadvantages increase as wafer sizes and transport distances increase. In addition, the accuracy of rotary arm mechanisms, which is important for proper positioning of wafers in semiconductor processing systems, is reduced as transport distances increase.

Alternatives to rotary arm mechanisms include linear transport mechanisms such as those employing guide tracks and bearings. However, the linear transport mechanisms which are currently available are not compatible with the particulate requirements of semiconductor processing equipment. The use of blocking techniques with standard linear transport mechanisms are more difficult than for rotary mechanisms. The potential particle sources of linear transport mechanisms, such as rails, guides, bearings, etc., cannot be easily localized. Typically, these potential particle sources will span the required transport length moving with and remaining near the wafer.

Pinch seals are commonly used in wet, dusty, or dirty environments to protect linear transport mechanisms from corrosion, abrasion, etc. FIG. 1 shows a prior art pinch seal 10 which is formed in a barrier 12 isolating a linear transport mechanism, such as a pneumatic cylinder, and a workpiece. The linear transport mechanism is connected to the workpiece with a relatively thin support member 14. This support member 14 extends through a narrow, fixed slot 18 in the barrier 12 separating the transport mechanism from the work environment. The slot 18 is provided with two flexible members or membranes 16 attached to the sides of the slot which contact each other to seal or block the slot. The support member 14 travels along the slot 18 and displaces the flexible members 16 as it moves down the slot. The flexible members 16 resiliently return to their closed position once the support member has passed. The support member 14 is thus pinched by the flexible sealing members 16 to prevent particulate transport from the linear transport area to the work environment.

The sliding contact between the support member 14 and the flexible sealing members 16 in the prior art pinch seal 10 provide a serious particle source, and thus, these pinch seals cannot be employed in a semiconductor processing system.

SUMMARY OF THE INVENTION

The device according to the present invention addresses the disadvantages of the prior art by providing a method and means by which a substrate such as a semiconductor wafer can be successfully isolated or shielded from extended, non-localized particle sources, such as linear transport mechanisms. The device provides a means by which the sliding contact of a known pinch seal and the resultant particle generation and wear can be eliminated while retaining the desired isolation between the transport mechanism and the wafer environment.

According to one aspect of the present invention, a semiconductor processing device includes a transport device for transporting a substrate within a work environment, the transport device including a transport mechanism and a substrate supporting member attached to the transporting mechanism, a barrier for separating the work environment from the transport mechanism of the transport device, the barrier having an elongated opening through which the substrate supporting member extends, a flexible seal for sealing the elongated opening in the barrier while allowing the substrate supporting member to move along the elongated opening, and means for opening the flexible seal to prevent contact between the flexible seal and the substrate supporting member while providing an effective particle barrier.

According to another aspect of the present invention, a sealing device includes a flexible sealing member positioned in an elongated opening in a barrier wall for preventing particles from passing through the elongated opening, a support member extending through the elongated opening and mounted for movement along a length of the elongated opening, and an opening device attached to the support member for opening the flexible sealing member, the opening device preventing contact between the flexible seal and the support member as the support member moves along the length of the elongated opening while providing an effective particle barrier.

According to another aspect of the present invention, a method of shielding a semiconductor substrate from non-localized particle sources includes providing an elongated flexible seal in an elongated opening in a shielding member, selectively opening and closing portions of the elongated flexible seal by creating a magnetic field which opens the flexible seal to pass a member through the flexible seal, and reducing particle generation by preventing contact between the flexible seal and the member passing through the flexible seal while retaining the isolating function of the shielding member. The particle isolation may be improved by the use of a purge gas flow, by electrostatic attraction, thermophoritic repulsion, or increased labyrinth seal.

BRIEF DESCRIPTION OF THE DRAWINGS

The invention will be described in greater detail with reference to the accompanying drawings in which like elements bear like reference numerals, and wherein:

FIG. 5 is a cross sectional top view of the pinch seal of FIG. 4, taken along line 5—5 of FIG. 4;

FIG. 6 is a cross sectional top view of a pinch seal according to a second embodiment of the invention; and FIG. 7 is a cross sectional top view of a pinch seal according to a third embodiment of the invention.

DETAILED DESCRIPTION OF THE PREFERRED EMBODIMENTS

Figure 1:
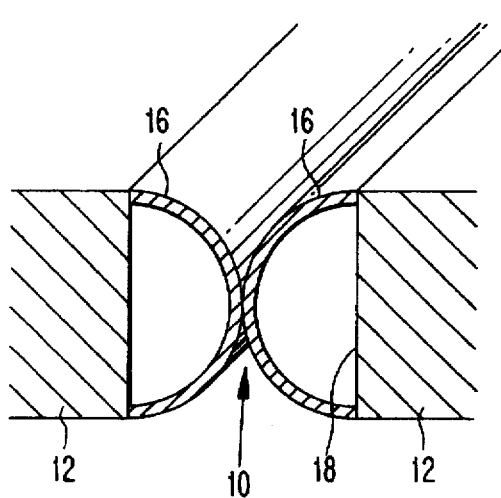
FIG. 1 is a cross sectional perspective view of a prior art pinch seal.
Figure 2:
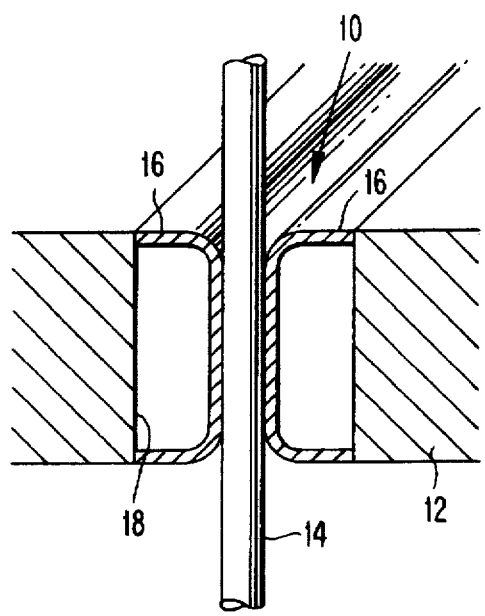
FIG. 2 is a cross sectional perspective view of the prior art pinch seal of FIG. 1 with a supporting member passing through the seal.

The present invention relates to a pinch seal in which particle generation by frictional contact between sealing parts and a movable member is prevented so that the pinch seal can be used in a semiconductor processing apparatus where particulate contamination is a serious problem. The pinch seal according to the present invention is particularly adapted for use in connection with a semiconductor wafer transport device, such as a linear transport device having a guide track and bearings. An example of a linear transport device for moving a semiconductor wafer can be found in commonly owned U.S. Pat. No. 4,833,790.

The present invention includes a barrier 30 provided between a transport device 32 and a semiconductor processing chamber or work environment 34 which prevents particle contaminants created by the transport device from entering the work environment. The barrier 30 is provided with an elongated slot 36 through which a thin support member 38 of the transport device 32 extends. A plurality of support members 38 may be used instead of a single support member for increased mechanical stability.

Figure 4:
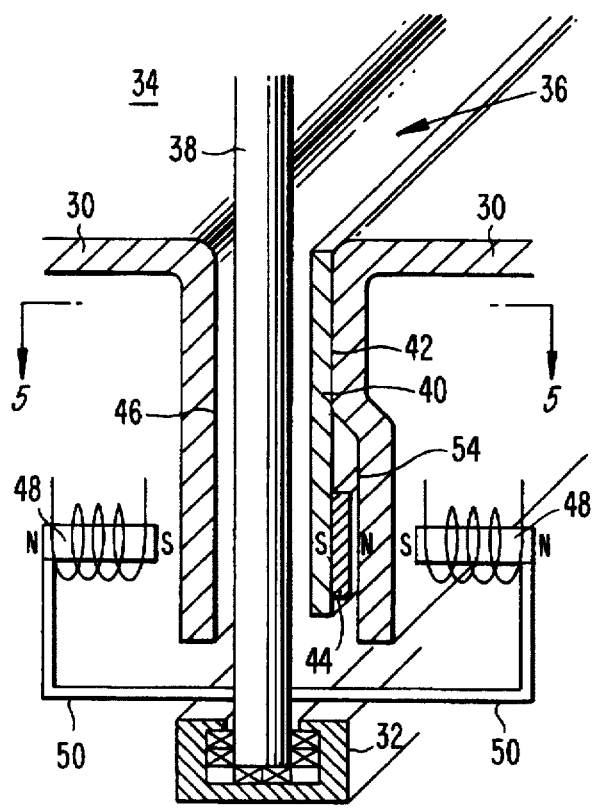
FIG. 4 is a cross sectional perspective view of the pinch seal of FIG. 3 with a supporting member passing through the seal.
Figure 3:
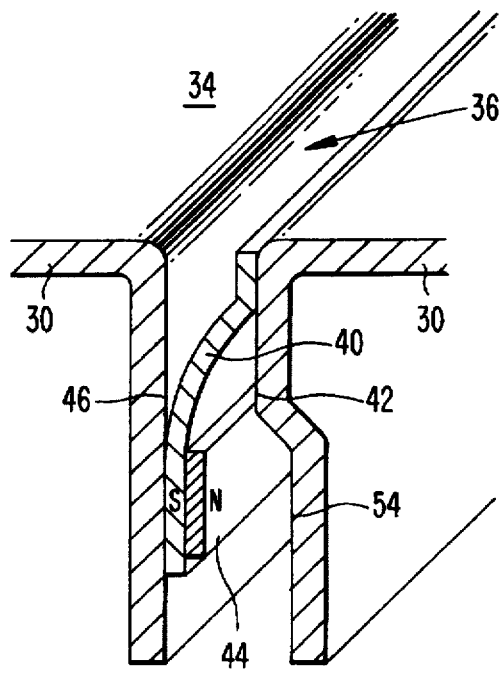
FIG. 3 is a cross sectional perspective view of a pinch seal according to the present invention.

As shown in FIG. 3, the elongated slot 36 is sealed by a flexible sealing member 40 consisting of a thin, compliant strip of resilient material. The flexible sealing member 40 is attached to a first side 42 of the slot 36 along a top edge of the flexible sealing member and has a magnetic strip 44 attached to a lower edge. In a closed position, shown in FIG. 3, the lower edge of the flexible sealing member 40 having the magnetic strip 44 is held against a second side 46 of the slot 36. The first side 42 of the slot 36 includes a recessed portion 54 extending along the length of the slot in which the magnetic strip 44 is received when the flexible sealing member 40 is in the open position, as shown in FIG. 4. Alternatively the magnetic strip may be integral with the flexible sealing member 40 and the recessed portion 54 may be omitted.

As shown in FIGS. 4 and 5, a set of magnets 48 which may be either electromagnetic coils or permanent magnets are located on opposite sides of the slot 36 at either side of the support member 38. The magnets 48 are attached to the support member 38 by magnet supports 50. The magnets 48 are located so as to precede the leading edge of the support member 38 in the direction of travel of the support member. The direction of travel of the support member 38 is shown by the arrow D in FIG. 5. The magnets 48 are oriented so that the magnets 48 cause the magnetic strip 44 to move toward the first side 42 of the slot 36. This has the effect of opening the flexible sealing member 40 directly in from of the leading edge of the support member 38.

When electromagnetic coils are used for the set of magnets 48, as in the embodiment of FIG. 4, current through the electromagnet coils is controlled so as to move the magnetic strip 44 toward the first side 42 of the slot at the leading edge of the support member.

According to a preferred embodiment illustrated in FIG. 6, an additional set of magnets 52 or magnetic coils may be provided on opposite sides of the slot 36 at a trailing edge of the support member 38. The additional set of magnets 52 or magnetic coils are oriented such that they reinforce the magnetic field at the trailing edge of the support member 38. Thus, the set of magnets 52 has the effect of closing the flexible sealing member 40 more quickly after the trailing edge of the support member 38 has passed through the slot 36.

Although the motion of the support member 38 has been describe above as moving in one direction it should be understood that most applications would involve bi-directional motion. Bi-directional motion of the support member 38 in a system using electromagnetic coils may be accomplished simply by reversing the polarity of the electromagnetic coils when the direction of motion is reversed. However, bi-directional travel using permanent magnets will require magnets to both open and close the flexible sealing member 40 at each end of the support member. As shown in FIG. 7, up to eight permanent magnets may be used including four magnets 48 which are oriented to open the flexible sealing member 40 and four magnets 52 which are oriented to close the flexible sealing member. The magnets 48 which are oriented to open the flexible sealing member are located closer to the support member 38 than the magnets 52 which are oriented to close the flexible sealing member. With the configuration of FIG. 7, the support member 38 may be moved bi-directionally.

The opening and closing of the flexible sealing member 40 with the magnets 48, 52 prevents any sliding contact from occurring between any parts or members of the seal. The flexible sealing member 40 is the only part which contacts another surface and this contact between the flexible sealing member and the sides of the slot 36 is a face contact without any sliding motion. This face contact causes minimal particle generation.

The nominal "open" clearance between the slot walls 36 and the support member 38 of the present invention are based on normal parts tolerances and dimensions. The length of the "open" clearance of the slot 36 is engineered to provide an adequate particle barrier and to prevent any sliding contact. The particle isolation properties of the "open" clearance gap of the slot 36 may be improved by the use of a purge gas flow through the open clearance. The particle isolation may also be improved by increased labyrinth seal, thermophoritic repulsion, electrostatic attraction, etc.

Although the present invention has been described as employing pairs of magnets or electromagnets it should be understood that single magnets could also be used to open and close the flexible sealing member 40. Although the actuation mechanism for opening and closing the flexible sealing member 40 has been described as employing magnetic forces, other forms of actuation such as electrostatic force, thermal control of bimetallic materials, shape memory alloys, etc. can also be used.

The present invention may also include two opposed flexible sealing members, one or both of which are externally actuated. In addition, the invention may include active sensing and control of the opening and closing of the flexible sealing member 40 profile at the leading and trailing edges of the support member 38.

The present invention provides distinct advantages over the prior art rotary arm mechanisms by allowing the use of readily available, reliable, and inexpensive linear transport mechanisms and components within a semiconductor manufacturing system while achieving the necessary particulate control. The present invention provides for isolation between the wafer transport environment and the linear movement mechanisms allowing increased choices of transport materials and mechanisms.

While the invention has been described in detail with reference to preferred embodiments thereof, it will be apparent to one skilled in the art that various changes can be made, and equivalents employed without departing from the spirit and scope of the invention.

What is claimed is:

1. A semiconductor processing device comprising:
    a transport device which transports a substrate within a work environment, the transport device including a transport mechanism and a substrate supporting member attached to the transport mechanism;
    a barrier separating the work environment from the transport mechanism of the transport device, the barrier having an elongated opening through which the substrate supporting member extends;
    a flexible seal sealing the elongated opening in the barrier while allowing the substrate supporting member to move along the elongated opening, the flexible seal being effective to minimize particles from passing through the opening into the work environment; and
    an opening device which opens the flexible seal, the opening device preventing contact between the flexible seal and the substrate supporting member while the substrate supporting member moves along the opening.

2. The semiconductor processing device according to claim 1, wherein the opening device is attached to the substrate supporting member and moves along with the substrate supporting member.

3. The semiconductor processing device according to claim 1, wherein the flexible seal includes a magnetic material and the opening device includes a magnet, the magnet interacting with the magnetic material so as to open or close the flexible seal at a localized area adjacent the magnet.

4. The semiconductor processing device according to claim 3, wherein the magnetic material is a strip of magnetic material attached to an edge of the flexible seal.

5. The semiconductor processing device according to claim 3, wherein the magnet comprises an electromagnet.

6. The semiconductor processing device according to claim 1, wherein the opening device prevents sliding contact between the flexible seal and the substrate supporting member.

7. The semiconductor processing device according to claim 1, wherein the opening device is located so as to precede a leading edge of the substrate supporting member in a direction of travel of the substrate supporting member.

8. The semiconductor processing device according to claim 1, further comprising a closing device which closes the flexible seal, the closing device being located so as to follow a trailing edge of the substrate supporting member in a direction of travel of the substrate supporting member.

9. The semiconductor processing device according to claim 1, wherein the substrate supporting member supports a semiconductor wafer in a particle-free vacuum environment and the opening device operates to open the flexible seal in conjunction with movement of the substrate supporting member along the elongated opening.

10. A sealing device comprising:
    a flexible sealing member positioned in an elongated opening in a barrier wall for preventing particles from passing through the elongated opening;
    a support member extending through the elongated opening and mounted for movement along a length of the elongated opening; and
    an opening device attached to the support member for opening the flexible sealing member, the opening device preventing contact between the flexible seal and the support member as the support member moves along the length of the opening while providing an effective particle barrier.

11. The sealing device according to claim 10, wherein the flexible sealing member is a resilient strip which includes a strip of a magnetic material, and the opening device includes a magnet.

12. The sealing device according to claim 11, wherein the opening device is located to precede a leading edge of the support member in a direction of travel of the support member.

13. The sealing device according to claim 11, further comprising a closing device for closing the flexible sealing member, the closing device located to follow a trailing edge of the support member in a direction of travel of the support member.

14. The sealing device according to claim 11, wherein the support member supports, a semiconductor wafer in a particle-free vacuum environment and the opening device operates to open the flexible sealing member in conjunction with movement of the support member along the elongated opening.

15. The sealing device according to claim 10, wherein the opening device comprises an electromagnet.

16. A method of shielding a substrate from non-localized particle sources comprising:
    providing a substrate in a working environment separated from an actuating mechanism by a shielding member, the actuating mechanism moving a member supporting the substrate while the member extends through an elongated flexible seal sealing an elongated opening in the shielding member;

forming an open area around the member by selectively opening and closing portions of the elongated flexible seal while moving the member along the opening through the open area in the flexible seal; and reducing particle generation by preventing contact between the flexible seal and the member moving through the open area in the flexible seal while retaining the isolating function of the shielding member.

17. The method of claim 16, wherein the member supports a semiconductor wafer in a particle-free vacuum environment.

18. The method of claim 16, wherein the open area is formed by a magnetic field.

19. The method of claim 16, wherein the flexible seal is biased so as to seal the opening and the open area is formed by a mechanism which does not physically contact the flexible seal.

* * * * *